United States Patent [19]

Blanchard

[11] Patent Number: 4,893,160
[45] Date of Patent: Jan. 9, 1990

[54] METHOD FOR INCREASING THE PERFORMANCE OF TRENCHED DEVICES AND THE RESULTING STRUCTURE

[75] Inventor: Richard A. Blanchard, Los Altos, Calif.

[73] Assignee: Siliconix Incorporated, Santa Clara, Calif.

[21] Appl. No.: 120,395

[22] Filed: Nov. 13, 1987

[51] Int. Cl.$^4$ .................... H01L 29/78; H01L 29/06
[52] U.S. Cl. ............................. 357/23.4; 357/55; 357/91
[58] Field of Search ................... 357/23.4, 55

[56] References Cited

U.S. PATENT DOCUMENTS

| 4,101,922 | 7/1978 | Tihanyi et al. | 357/23.4 |
| 4,366,495 | 12/1982 | Goodman et al. | 357/23.4 |
| 4,376,286 | 3/1983 | Lidow et al. | 357/23.4 |
| 4,553,151 | 11/1985 | Schutten et al. | 357/55 |
| 4,608,584 | 8/1986 | Mihara | 357/55 |
| 4,672,410 | 6/1987 | Miura et al. | 357/41 |

OTHER PUBLICATIONS

Ueda et al., IEEE Trans. on Electron Devices, "An Ultra-Low On-Resistance Power MOSFET Fabricated by Using a Fully Self-Aligned Process", (Apr. 1987), vol. ED-34, No. 4, pp. 926-930.
Chang et al., IEEE Trans. on Electron Devices, "Self-Aligned UMOSFET's with a Specific On-Resistance of 1 m·cm$^2$", (Nov. 1987), pp. 2329-2334.
Leistiko, Jr. and Grove, Solid State Electronics, "Breakdown Voltage of Planar Silicon Junctions", (1966), pp. 847-852.
Blanchard, A Dissertation Submitted to the Department of Electrical Engineering and the Committee on Graduate Studies of Stanford University, "Optimization of Discrete High Power MOS Transistors", (Dec. 1981), Chapter III, Maximizing the Breakdown Voltage of Vertical Power MOSFET Structures, pp. 16-32.

Primary Examiner—Andrew J. James
Assistant Examiner—Robert P. Limanek
Attorney, Agent, or Firm—Steven F. Caserza

[57] ABSTRACT

A trenched device, such as a DMOS transistor, provides for higher breakdown voltages than possible using trenched devices of the prior art. The trench extends only into the epitaxial layer, thereby minimizing breakdown problems associated with prior art trench devices in which the trench extends into the more highly doped substrate. However, in order to achieve higher breakdown voltages, the dopant concentration is increased in that portion of the epitaxial layer surrounding the bottom of the trench. Thus, a novel trenched device is taught which achieves higher breakdown voltages by causing the trench to be surrounded by relatively highly doped material, while not requiring the trench to extend into the more highly doped substrate itself.

8 Claims, 5 Drawing Sheets

METHOD FOR INCREASING THE PERFORMANCE OF TRENCHED DEVICES AND THE RESULTING STRUCTURE

BACKGROUND OF THE INVENTION

This invention pertains to semiconductor devices, and more particularly to trenched semiconductor devices having relatively high breakdown voltages.

Trenched double diffused metal oxide silicon (DMOS) transistors such as the ones discussed in the article, "An Ultra-Low ON Resistance Power MOSFET Fabricated by Using a Fully Self-Aligned Process" by Ueda, Takagi & Kano (IEEE Transactions on Electron Devices, Vol. ED-34, No. 4, April 1987, pp. 926–930) offer a method of significantly reducing the onresistance per unit area compared with conventional vertical DMOS devices.

Prior art DMOS transistors are described, for example, in "Self-Aligned UMOSFET's with a Specific On-Resistance of 1 mΩ·cm²", Chang et al., IEEE Transactions on Electron Devices, Vol. ED-34, No. 11, November 1987, pp. 2329–2334, and "An Ultra-Low On-Resistance Power MOSFET Fabricated by Using a Fully Self-Aligned Process", Ueda et al., IEEE Transactions on Electron Devices, Vol. ED-34, No. 4, pp. 926–930, April 1987.

One example is the low voltage prior art trenched DMOS transistor shown in the cross-sectional view of FIG. 1. As shown in FIG. 1, trenched DMOS transistor 10 includes substrate 11, upon which is formed an epitaxial layer 12, which is more lightly doped than substrate 11. Metallic layer 13 is formed on the bottom of substrate 11, allowing an electrical contact 14 to be made to substrate 11. As is known to those of ordinary skill in the art, DMOS transistors also include source regions 16a, 16b, 16c, and 16d, and body regions 15a and 15b. Epitaxial region 12 serves as the drain. In the example shown in FIG. 1, substrate 11 is relatively highly doped with N type dopants, epitaxial layer 12 is relatively lightly doped with N type dopants, source regions 16a, 16b, 16c, and 16d are relatively highly doped with N type dopants, and body regions 15a and 15b are relatively highly doped with P type dopants. A polycrystalline silicon gate electrode 18 is formed within a trench, and is electrically insulated from other regions by gate dielectric layer 17 formed on the bottom and sides of the trench containing gate electrode 18.

FIG. 2 shows another trenched DMOS transistor 20 designed for higher voltage operation. In DMOS transistor 20, trench 18 extends only part way through epitaxial region 12. By extending the trench only part way through lightly doped epitaxial region 12, higher voltage operation is obtained.

However, the development of higher voltage devices is not without its problems. Two problems in particular are the potential reduction in breakdown voltage caused by the corner regions at the bottom of the trench because of the increase of the electric field at corners, and the resistance caused because carriers do not spread out once they leave the channel region. In the fabrication of low voltage devices (30–90 V), it is possible to choose a trench depth so its bottom surface is below the interface of the epitaxial layer 12 and the substrate 11 as shown in FIG. 1. The heavy doping concentration in substrate 11 at the corners of the trench limits carrier velocity, increasing the breakdown voltage of the device. In addition, with the carriers flowing from channel 24a, 24b (FIG. 1) directly along an accumulated surface (along the sidewall of the trench) and directly into heavily doped substrate 11, there is little additional resistance added by lightly doped epitaxial layer 12. The breakdown voltage of the trenched DMOS structure of FIG. 1 may be limited by one or more of the following phenomena:

1. Avalanche breakdown at the P+/N junction formed at the interface between P+ body region 15a, 15b and N type epitaxial region 12.

2. Field plate induced breakdown along the sides or bottom of the trench caused by the electric field.

3. Reachthrough breakdown caused by the spreading of the depletion region from the P+/N junction formed at the interfere between P+ body regions 15a, 15b and epitaxial region 12 through epitaxial region 12 to N+ substrate 11.

The above phenomena related to breakdown voltages are well known and are described, for example, in "Breakdown Voltage of Planar Silicon Junctions", Leistiko and Grove, Solid State Electronics, Pergeman Press 1966, Vol. 9, pp. 847–852, and "Optimization of Discrete High Power MOS Transistors", Blanchard, Dissertation Submitted to the Department of Electrical Engineering of Stanford University, December 1981.

The fabrication of trenched DMOS devices with higher breakdown voltages (100 V or greater) may not be possible when the trench extends into N+ substrate 11. However, if the trench ends in N- type epitaxial layer 12 as shown in FIG. 2, the problem of cornerenhanced breakdown and increased on-resistance mentioned above may occur.

Accordingly, prior art techniques for fabrication of trench DMOS devices have not lead to the fabrication of trench DMOS devices with high breakdown voltages and low on-resistances per unit area.

SUMMARY

A novel trenched device, such as a DMOS transistor, is taught which provides for higher breakdown voltages than possible using trenched devices of the prior art. In accordance with the teachings of this invention, the trench extends only into the epitaxial layer, thereby minimizing breakdown problems associated with prior art trench devices in which the trench extends into the more highly doped substrate. However, in order to achieve higher breakdown voltage, the dopant concentration is increased in that portion of the epitaxial layer surrounding the bottom of the trench. Thus, in accordance with the teachings of this invention, a novel trenched device is taught which achieves higher breakdown voltages by causing the trench to be surrounded by relatively highly doped material, while not requiring the trench to extend into the more highly doped substrate itself. The teachings of this invention are also applicable to trenched devices other than trenched DMOS devices.

DETAILED DESCRIPTION

Figure 3:
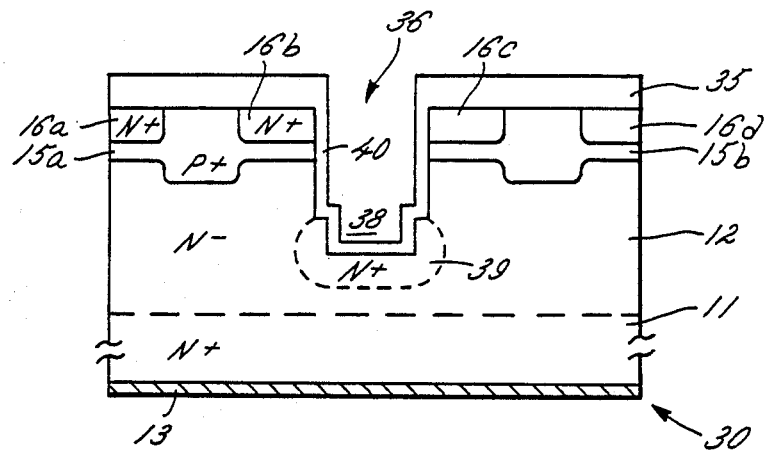
FIG. 3 is a cross-sectional view of a high voltage trenched DMOS transistor constructed in accordance with the teachings of this invention.

One embodiment of a trenched DMOS device constructed in accordance with the treachings of this invention is shown in the cross-sectional view of FIG. 3. As shown in FIG. 3, trenched DMOS device 30 includes metallic substrate electrode 13, substrate 11, epitaxial region 12, body regions 15a and 15b, and source regions 16a, 16b, 16c, and 16d. However, in accordance with the teachings of this invention, N+ region 39 is added along the lower sides and bottom of trench 36, or alternatively just along the bottom of trench 36. N+ region 39 reduces carrier mobility in epitaxial layer 12 near the corners of trench 36, increasing the breakdown voltage and also significantly increasing the conductivity of epitaxial layer 12 in this region, thereby decreasing the device onresistance.

Figure 4J:
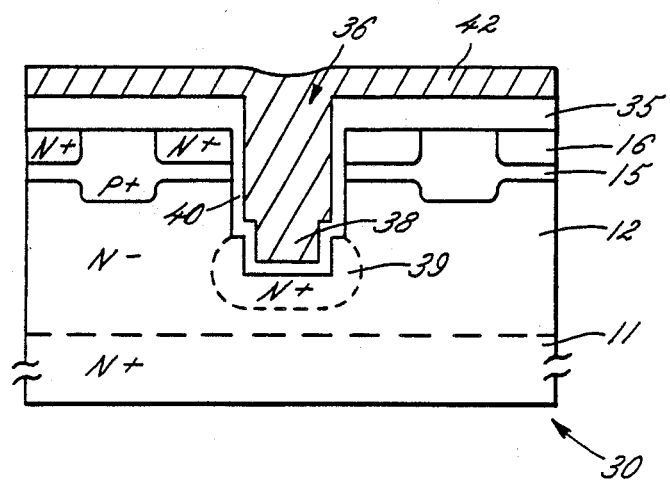
FIGS. 4a through 4j are cross-sectional view depicting the process sequence for fabricating the trenched DMOS transistor of FIG. 3 constructed in accordance with the teachings of this invention.
Figure 4A:
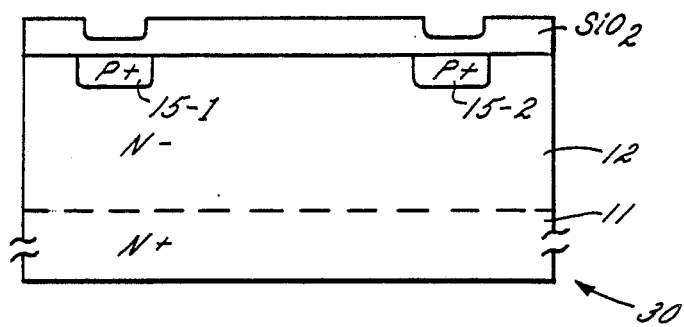

FIG. 4a shows a cross-sectional view of a semiconductor device partway through its fabrication process. As shown in FIG. 4a, device 30 includes substrate 11, which typically comprises silicon which may be relatively heavily doped with N type impurities, such as to a concentration within the range of approximately $10^{18}$ to $10^{19}$ atoms/cm$^3$. Formed on substrate 11 is epitaxial layer 12, which in one embodiment is formed of silicon more lightly doped with N type impurities, such as phosphorous or arsenic, to a concentration within the range of approximately $10^{14}$ to $10^{16}$ atoms/cm$^3$. As shown in FIG. 4a, a layer of silicon dioxide is grown, for example by thermal oxidation, to a thickness within the range of approximately 3,000 10,000 Å. A layer of photoresist (not shown) is formed on the surface of the wafer and, using suitable photolithographic techniques patterned and the wafer is etched, for example by plasma etching, to expose those portions of epitaxial layer 12 where P type regions 15-1, 15-2 are to be formed. P type dopants are then introduced into epitaxial layer 12, for example by diffusion or implantation of boron to a sheet resistance of approximately 25 to 200 ohms/square. If desired, a drive-in step is used to redistribute the P type dopants, during which a small portion of silicon dioxide is formed on the surface of the wafer above regions 15-1 and 15-2.

Figure 4B:
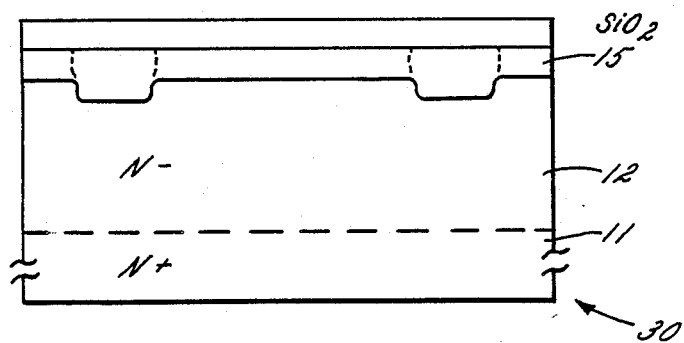

As shown in FIG. 4b, the silicon dioxide layer is then removed, and a blanket implant of P type dopants, for example boron, is made in order to cause body region 15 to be formed, which in this embodiment are doped with a P type impurity such as boron to a sheet resistance of approximately 100 to 1,000 ohms/square. These dopants are then driven, and during which time another silicon dioxide layer is formed on the surface of the wafer.

Figure 4C:
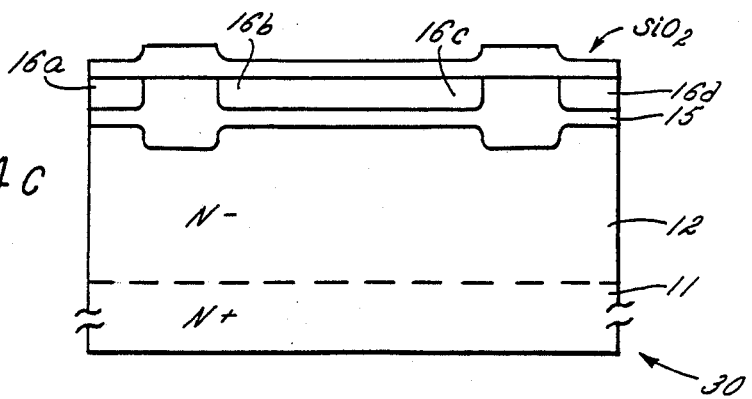

Referring to FIG. 4c, a layer of photoresist (not shown) is formed on the surface of the wafer and patterned to expose portions of the silicon dioxide layer where N type dopants are to be introduced into body region 15 in order to form source regions 16a, 16b, 16c, and 16d. The exposed portions of silicon dioxde layer are then removed, for example with a plasma etch, and N type dopants such as phosphorous or arsenic introduced and driven to provide source region 16a, 16b, 16c, and 16d having a sheet resistance of approximately 5 to 30 ohms/square.

Figure 4D:
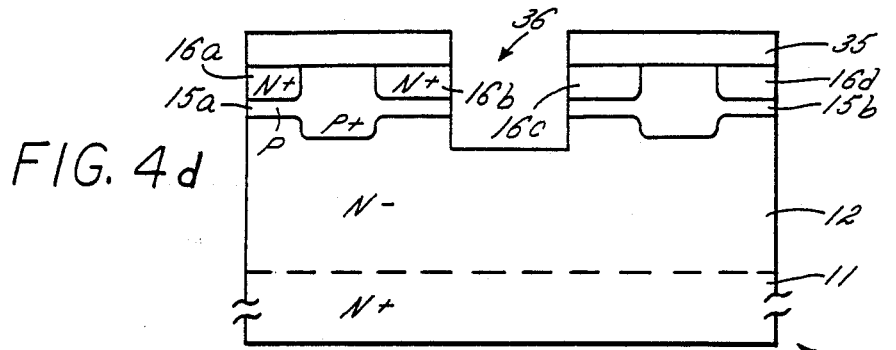

As shown in FIG. 4d, the silicon dioxide is then removed and a layer of photoresist 35 is then placed on the top surface of the wafer and patterned to expose that portion of the wafer where trench 36 is to be formed. Trench 36 is then formed, for example by etching using reactive ion etching (RIE) to a depth of approximately 4–6 μm, or in other words approximately 1–3 μm beneath the PN junction formed between epitaxial region 12 and body regions 15a, 15b along the sidewall of trench 36. Trench 36 is formed, for example, using any well known prior art technique for trench formation, or in the manner taught by copending United States Patent Application Serial No. 06/843,454, filed Mar. 24, 1986 and assigned to Siliconix incorporated, the assignee of this application.

Figure 4E:
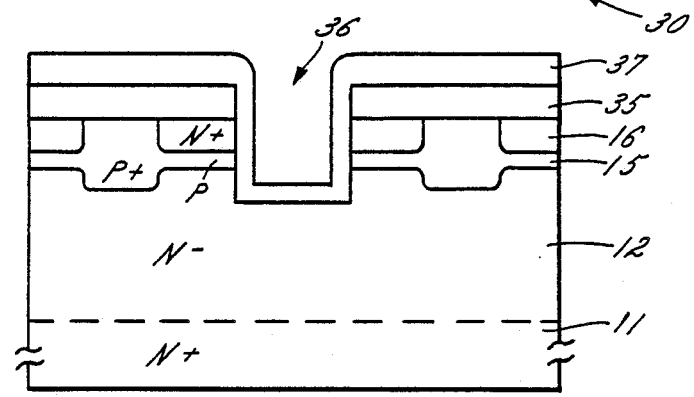

As shown in FIG. 4e, a dielectric layer 37 is then formed on the top surface of the wafer, and the bottom and sides of trench 36. Dielectric layer 37 may be formed, for example, of silicon dioxide to a thickness of approximately 0.05 to 0.3 μm by thermal oxidation.

Figure 4F:
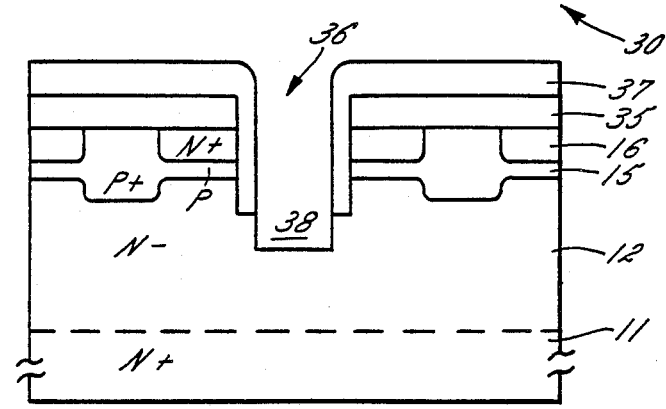

Referring to FIG. 4f, a layer of photoresist (not shown) is formed on the wafer such as to expose trench 36. The portion of dielectric layer 37 located on the bottom of trench 36 is removed, for example by reactive ion etching. Remaining portons of dielectric layer 37 are not etched at this time because of the vertical direction of the reactive ion etch. Following removal of the portion of dielectric layer 37 on the bottom of trench 36, trench 36 is etched deeper, for example by reactive ion etching, thereby forming trench extension 38 while increasing the depth of trench 36 by approximately 1 to 5 μm. At this time, an N type dopant such as phosphorous or arsenic is introduced into trench 36 in order to form a relatively highly doped N type region 39 (FIG. 4g) surrounding the sides and bottom of trench extension 38. This is performed, for example, by ion implantation of phosphorous or arsenic at an energy of approximately 20 to 200 KeV to provide a sheet resistance in region 39 of approximately 100 to 1,000 ohms/square.

Figure 1:
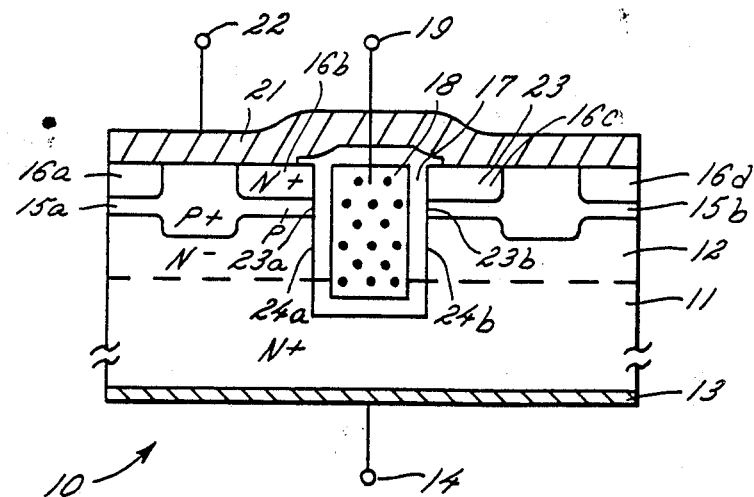
FIG. 1 is a cross-sectional view of a prior art low voltage trenched DMOS transistor.
Figure 2:
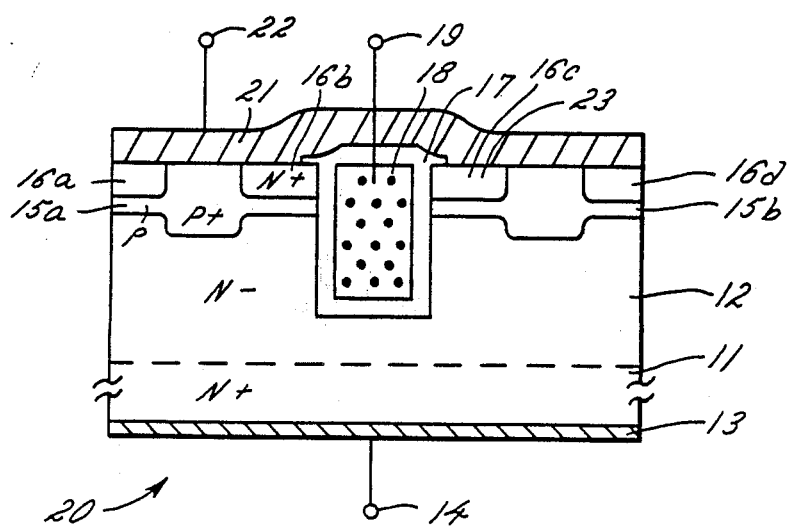
FIG. 2 is a cross-sectional view of higher voltage trenched DMOS transistor of the prior art.

Of importance, introducing dopants to form region 39 having lower sheet resistance than the sheet resistance of epitaxial region 12, there is a tradeoff between breakdown voltage, which decreases with increased doping of region 39, and on-resistance of the device, which decreases with increasing doping of region 39. Practically, the doping concentration of region 39 should be increased to a minimum of approximately twice the doping concentration of epitaxial region 12, in order to obtain some decrease in device on-resistance. The upper practical limit for increasing the doping concentration of region 39 is the solid solubility of the dopant in silicon, typically a concentration several orders of magnitude greater than the concentration of the dopant in epitaxial layer 12. Of course, it would serve no purpose to increase the dopant concentration within region 39 to a greater dopant concentration than that of substrate 11, because in that case, the breakdown voltage of the device would not be greater than the breakdown voltage of the prior art device of FIG. 1, in which the trench extends into the substrate itself. In the example given here, the background concentration of epitaxial layer 12 is within the range of approximately $10^{15}$ to $10^{17}$ atoms/cm$^3$. Introducing additional dopants into region 39 raises the peak dopant concentration in region 39 to within the range of approximately $5 \times 10^{17}$ to $5 \times 10^{19}$ atoms/cm$^3$, although these dopants are redistributed within region 39, and thus the actual doping concentration of region 39 is slightly less than the peak dopant concentration mentioned above.

Figure 4G:
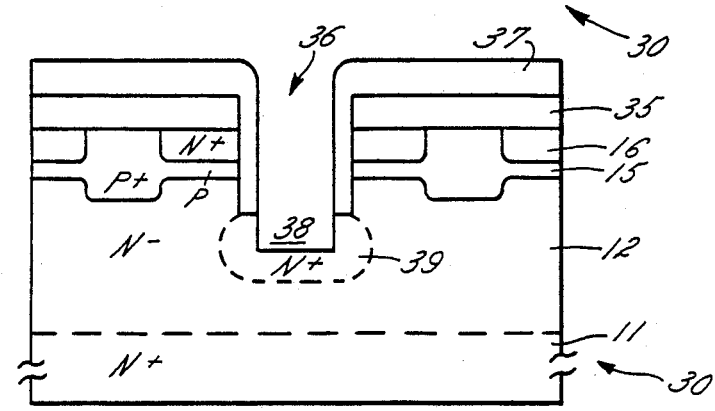
Figure 4H:
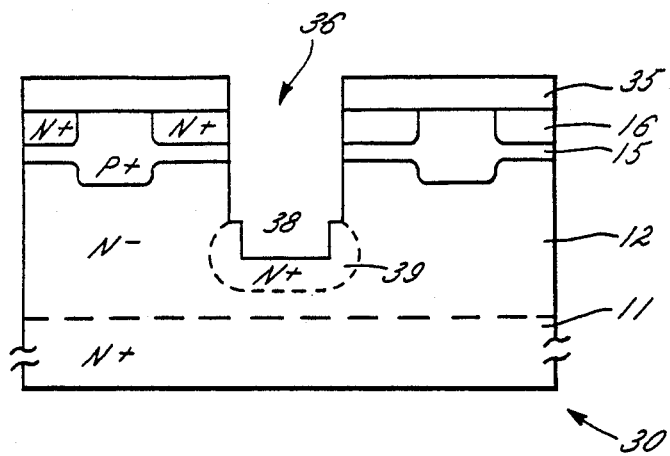
Figure 4I:
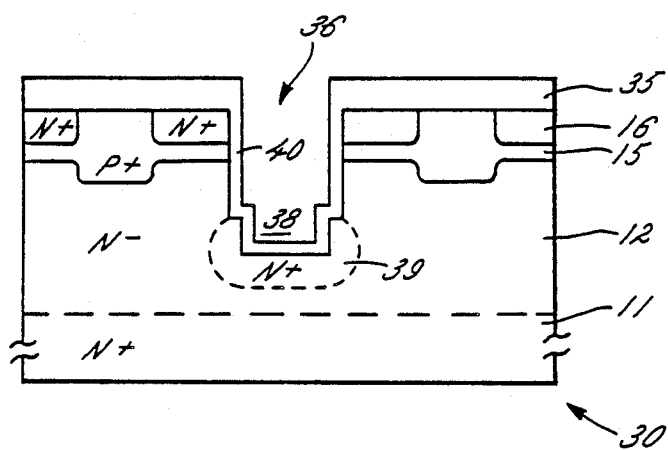

Referring to FIG. 4h, dielectric layer 37 is then removed from the top of the wafer and sides of trench 36, for example by plasma etching. As shown in FIG. 4i, gate dielectric layer 40 is then formed on the bottom and sides of trench 36. Gate dielectric 40 comprises, for example, silicon dioxide formed to a thickness of approximately 0.05 to 0.2 μm by thermal oxidation.

As shown in FIG. 4j, a layer 42, for example, of polycrystalline silicon is then formed on the top surface of the wafer and completely filling trench 36. Layer 42, formed of polycrystalline silicon or any other suitable material, serves as the gate electrode for trenched DMOS transistor 30 of FIG. 4j. As shown in FIG. 4j, the top surface of polycrystalline silicon layer 42 is not flat, but contains a depression located above trench 36. If desired, portions of layer 42 outside of trench 36 may be etched away using reactive ion etching, or it may be patterned and etched in order to form an electrical interconnect layer of the device.

The remaining steps of contact formation, metallization, passivation, and back-side metallization are then performed in a well known manner in order to complete fabrication of the device.

Figure 5:
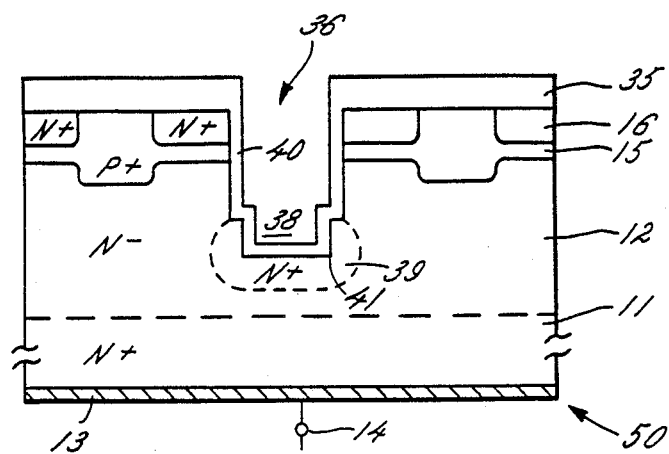
FIG. 5 is a cross-sectional view of an alternative embodiment of this invention.

While the discussion above and the drawings forus on a trenched DMOS device, these same concepts are valid for other trenched devices as well, such as trenched IGBTs and JFETs. Also, while the exemplary fabrication sequence described above in conjunction with the cross-sectional views of FIGS. 4a–4j teach the formation of gate oxide 40 along the entire sidewall and bottom of trench 36 at the same time, an alternative embodiment forms gate oxide 40 and a two-step process. For example, one such embodiment uses a dielectric which serves as an oxide mask, such as silicon nitride (or a first of silicon dioxide and a second layer of silicon nitride), as dielectric layer 37 (FIG. 4e). Following the implantation of dopants to form region 39, as shown in FIG. 4g, the portions of the sides of trench 36, and the bottom of trench 36, which are not protected by dielectric layer 37 are oxidized. Then, dielectric layer 37 is removed, and the wafer is then oxidized, thereby forming a gate oxide on the portion of the wall of trench 36 which was previously protected by dielectric layer 37. The thickness of the oxide which was formed in the trench in areas not previously protected by dielectric layer 37 is slightly increased at this time. Using this technique, a trench 36 is formed with two independent thicknesses of gate oxide 40, 41, as shown in FIG. 5.

All publications and patent applications are herein incorporated by reference to the same extent as if each individual publication or patent application was specifically and individually indicated to be incorporated by reference. The invention now being fully described, it will be apparent to to one of ordinary skill in the art that many changes and modifications can be made thereto without departing from the spirit or scope of the appended claims.

What is claimed is:

1. A semiconductor device comprising:
   a first region of semiconductor material, doped to a first concentration with a dopant of a first conductivity type, and serving as a drain region;
   a trench formed within said first region, said trench having sides and a bottom;
   a second region of semiconductor material located within said first region and adjacent to said trench near said bottom of said trench, said second region being of said first conductivity type and having a higher dopant concentration than said first region;
   a gate electrode within said trench; a layer of gate dielectric insulating said gate electrode from said first and second regions;
   a source region formed on the surface of said first semiconductor region; and
   a body region within said first region beneath said source region, said body region having a second conductivity type opposite said first conductivity type.

2. A semiconductor device as in claim 1 wherein said gate electrode is formed of conductive material.

3. A semiconductor device as in claim 2 wherein said conductive material is selected from the group of materials consisting of aluminum, alloys of aluminum, polycrystalline silicon, refractory metals, and combinations of polycrystalline silicon and refractory metals.

4. A semiconductor device as in claim 3 wherein said gate dielectric is located along said sides and bottom of said trench.

5. A semiconductor device as in claim 1 which further comprises a semiconductor substrate upon which said first region is located.

6. A semiconductor device as in claim 1 wherein said semiconductor substrate is doped to said first conductivity type to a higher dopant concentration than said first semiconductor region.

7. A semiconductor device as in claim 1 wherein said first region is doped to a bulk dopant concentration within the range of approximately $10^{14}$ to $10^{16}$ atoms/cm$^3$ and said second region is doped to have a sheet resistivity with the range of approximately 100 to 1,000 ohms/square.

8. A semiconductor device as in claim 1 wherein said second region is formed beneath said trench and extends above the bottom of said trench along at least a portion of the periphery of said trench.

* * * * *

UNITED STATES PATENT AND TRADEMARK OFFICE
CERTIFICATE OF CORRECTION

PATENT NO. : 4,893,160
DATED : January 9, 1990
INVENTOR(S) : Richard A. Blanchard It is certified that error appears in the above-identified patent and that said Letters Patent is hereby corrected as shown below:

Column 1, line 17 "onresistance" should read --on-resistance--.

Column 3, line 24 "onresistance" should read -- on-resistance--.

Column 3, line 38, "3,00010,000" should read --3,000 - 10,000--.

Column 4, line 27, "portons" should read --portions--.

Column 5, line 27, "forus" should read --focus--.

Signed and Sealed this

Fourteenth Day of May, 1991

Attest:

HARRY F. MANBECK, JR.

*Attesting Officer*  *Commissioner of Patents and Trademarks*